United States Patent
Horst et al.

(10) Patent No.: US 10,234,498 B2
(45) Date of Patent: Mar. 19, 2019

(54) AUTOMATED TEST EQUIPMENT FOR TESTING A DEVICE UNDER TEST AND METHOD FOR TESTING A DEVICE UNDER TEST

(71) Applicants: Jonas Horst, Fichtenberg (DE); Heinz Nuessle, Rottenburg am Neckar (DE); Bernd Laquai, Stuttgart (DE)

(72) Inventors: Jonas Horst, Fichtenberg (DE); Heinz Nuessle, Rottenburg am Neckar (DE); Bernd Laquai, Stuttgart (DE)

(73) Assignee: ADVANTEST CORPORATION, Tokyo (JP)

(*) Notice: Subject to any disclaimer, the term of this patent is extended or adjusted under 35 U.S.C. 154(b) by 208 days.

(21) Appl. No.: 15/051,479

(22) Filed: Feb. 23, 2016

(65) Prior Publication Data
US 2016/0169962 A1    Jun. 16, 2016

Related U.S. Application Data

(63) Continuation of application No. PCT/EP2013/067943, filed on Aug. 29, 2013.

(51) Int. Cl.
| | |
|---|---|
| *G01R 31/28* | (2006.01) |
| *G01R 31/3183* | (2006.01) |
| *G01R 31/319* | (2006.01) |
| *G06F 11/273* | (2006.01) |

(52) U.S. Cl.
CPC ..... *G01R 31/2834* (2013.01); *G01R 31/2877* (2013.01); *G01R 31/31903* (2013.01); *G01R 31/318307* (2013.01); *G06F 11/273* (2013.01); *G06F 11/2736* (2013.01)

(58) Field of Classification Search
None
See application file for complete search history.

(56) References Cited

U.S. PATENT DOCUMENTS

| | | | |
|---|---|---|---|
| 6,621,321 B2 | 9/2003 | Goldstein et al. | |
| 6,642,707 B1 | 11/2003 | Iorga et al. | |
| 6,759,854 B2 | 7/2004 | Logisch | |
| 6,836,136 B2 | 12/2004 | Aghaeepour | |
| 2004/0239380 A1* | 12/2004 | Hecht | H03K 19/01837 327/109 |
| 2004/0255213 A1* | 12/2004 | Moessinger | G01R 31/31716 714/729 |
| 2007/0216435 A1 | 9/2007 | Iguchi | |
| 2008/0004829 A1* | 1/2008 | Gorin | G05B 23/0256 702/108 |
| 2008/0223555 A1* | 9/2008 | Di Stefano | F25B 49/02 165/101 |
| 2012/0133380 A1 | 5/2012 | Ishikawa | |

FOREIGN PATENT DOCUMENTS

JP    2010054313    11/2010

OTHER PUBLICATIONS

Machine Tranlation of JP 2010054313 A, Takeda, Published on Mar. 11, 2010 (Applicant Admittted Prior Art cited on IDS dated Feb. 23, 2016).*

* cited by examiner

*Primary Examiner* — Jermele M Hollington
*Assistant Examiner* — Suresh K Rajaputra

(57) ABSTRACT

An automated test equipment for testing a device under test includes a control unit and a plurality of tester subunits. The control unit is configured to put the tester subunits in a state of lower activity in dependence on a current demand on the test resources.

20 Claims, 4 Drawing Sheets

AUTOMATED TEST EQUIPMENT FOR TESTING A DEVICE UNDER TEST AND METHOD FOR TESTING A DEVICE UNDER TEST

CROSS-REFERENCE TO RELATED APPLICATIONS

This application is a continuation of copending International Application No. PCT/EP2013/067943, filed Aug. 29, 2013, which is incorporated herein by reference in its entirety.

BACKGROUND OF THE INVENTION

Embodiments of the present invention relate to an automated test equipment for testing a device under test. Further embodiments of the present invention relate to a method for testing a device under test.

The cost of test is a critical economic aspect for semiconductor manufacturers and semiconductor test companies (test houses) and thus a key competitive value for automated test equipment (ATE). The cost of electrical energy is becoming an increasingly important portion of the overall test costs, since integrated semiconductor devices (IC) increase in speed, transistor count and system complexity with the constant achievements of modern semiconductor technology. The consequence is a similarly growing demand in speed, accuracy and parallelism combined with a demand for more flexibility and broader application coverage for testing these ICs on ATE. Such a demand is currently satisfied at the expense of a significant increase in power consumption for operating ATE and its related infrastructure.

The competitive operation of a test floor containing many ATE is only possible when the equipment can be adapted quickly to a large portfolio of devices and applications. Therefore ATE necessitates the presence of a flexible pool of many configurable tester subunits. With respect to the time critical management of production the stability of ATE on a test floor in terms of functionality and accuracy is essential. In the past the stability was ensured by keeping ATE powered all the time with all its resources and infrastructure fully active, resulting in a growing cost for the electrical energy supplied to the ATE. In addition, the thermal management system of ATE also shows increasing thermal output energy to maintain stable temperature conditions for precise operation. This energy in turn needs to be transported out of the production building spending additional energy. Therefore a growing amount of energy consumption is observed for the air conditioning of the test floor buildings and the heat exchangers of global cooling units on the production plants. This energy also contributes to a constantly growing cost of test.

Also in those countries where mass production of semiconductors is predominantly found, an increasing consciousness for environmental protection is emerging, particularly in the presence of the global warming discussion all over the world. Therefore it can be observed that the decision on what production equipment is used/purchased is more and more influenced by governmental programs and local legislation aiming at a transition to more environmentally compatible, but also more costly ways of producing electrical energy as well as by the higher energy taxes. This means that the more and more inevitable use of so called "green" energy will be an additional driver for higher cost of test even in Asian production sites. The reaction of the semiconductor industry is therefore a much stronger focus to low energy consumption of manufacturing equipment than what we saw in the past.

A more consumption-aware power control is further justified by frequently occurring stability issues in the power supply network of a production environment. The energy capacity of the supply network is often close to the limits and overload situations can't be resolved quickly when the equipment constantly maintains its full power demand.

Hence, there is a need for a reduction of the power consumption of an automated test equipment which would help to avoid or to recover front overload situations and therefore would help to both stabilize production and to increase the MTBF (mean time between failure) of an automated test equipment.

SUMMARY

According to an embodiment, an automated test equipment for testing a device under test may have: a control unit; and a plurality of tester subunits; wherein the control unit is configured to put the tester subunits in a state of lower activity in dependence on a current demand on the tester subunits.

According to another embodiment, a method for testing a device under test may have the steps of: putting a tester subunit of an automated test equipment for testing a device under test in a state of lower activity in dependence on a current demand on the tester subunit.

Another embodiment may have a non-transitory digital storage medium having a computer program stored thereon to perform the inventive method when said computer program is ran by a computer.

An embodiment of the present invention provides an automated test equipment for testing a device under test. The automated test equipment comprises a control unit and a plurality of tester subunits. The control unit is configured to put the plurality of tester subunits in a state of lower activity (compared to a state of higher activity) in dependence on a current demand on the tester subunits.

It has been found by the inventors that a more power-efficient concept for testing a device under test can be provided when an automated test equipment for testing such device under test comprises a control unit which is configured to put resources which are currently not needed (on which there is currently no demand) in a state of lower activity when compared to a state of higher activity in which such a tester subunit is in conventional systems typically operated, even if there is currently no demand for such a tester subunit. Hence, the inventors have found that it is advantageous to put tester subunits which are currently not needed in a state of lower activity in which these tester subunits typically consume less current than in a state of higher activity. By putting tester subunits which are currently not used or not needed (e.g. for performing a certain test on the device under test) into a state of lower activity a current consumption of these tester subunits can be dramatically reduced without losing any functionality of the automated test equipment.

According to further embodiments of the present invention the control unit is configured to put tester subunits which are currently in the state of lower activity in a state of higher activity, for example, when these tester subunits are currently needed, e.g. for performing a test program. To summarize, according to embodiments of the present invention, it can be achieved that only these tester subunits are in a state of higher activity (in which they consume more power or current when compared to a state of lower activity) which are currently needed (on which there is currently a demand) or which can't be put in such state of lower activity because of safety reasons or specification reasons.

According to further embodiments of the present invention, the control unit is configured to run a test program and to control based on the test program the plurality of tester subunits. Furthermore, the control unit is configured to derive the current demand on the tester subunits based on a current utilization of the plurality of tester subunits in the test program. Hence, the control unit is configured to automatically (without the need for any instructions in the test program or test program code) determine the utilization of the tester subunits and to derive based on this determined utilization if there is a current demand on a certain tester subunit and to put this tester subunit into its state of lower activity, when there is currently no demand on this certain tester subunit. In other words, according to the embodiments of the present invention the power consumption of a tester subunit can be controlled automatically by the automated test equipment without any manual user input or user control. Nevertheless, according to further embodiments, the control unit may also be configured to receive a user input signal based on which the control unit puts one or more of the plurality of tester subunits into a state of lower activity.

By having the automated detection of the utilization of the tester subunits and by automatically putting tester subunits into a lower state of activity or into a higher state of activity (e.g. when the tester subunits are currently needed) the test program can be free of any instruction, which instructs the control unit to put one or more of the plurality of tester subunits into the state of lower activity. Hence, the responsible user who creates the test program does not have to take care of the reduction of power consumption of the tester subunits by manually placing unneeded tester subunits into as state of lower activity, as this is already performed automatically by the control unit of the automated test equipment while running the test program. Furthermore, existing test programs which are programmed for conventional automatic test equipment don't have to be changed to benefit from the new automatic test equipment as the control unit can automatically derive the utilization of the tester subunits from the test program and put the tester subunits into the state of lower activity which are currently not needed or not used.

A state of lower activity can be, for example, as state in which the tester subunit consumes less power when compared to a state of higher activity (e.g. in which the tester subunits perform the test on the device under test) but in which the tester subunit is still activated. Furthermore, a state of lower activity can also be a state in which the tester subunit is completely deactivated (and consumes no current at all).

The inventors have found that when a tester resource or a tester subunit is put into a state of lower activity (a low power state or when it is deactivated) because there is currently no need to supply power to the tester subunit, its ability to perform according to certain specifications (to perform inside given specification limits) after turning on the tester subunit (after putting the tester subunit into a state of higher activity) may be affected. Therefore, the control unit can be configured to process specifically generated status information received from the tester subunits and related to the accuracy of the tester subunits. This status information may be produced from a plurality of sensors and parameters supplied by the operating system or stored in the hardware. In dependence on the user input and/or factory supplied information the control unit can either keep the tester subunit in the in-specification-state (inside the specification limits) with a minimum of power supplied or the control unit ensures that the tester subunit attains the in-specification-state after being activated for operation (after being put into a higher state of activity) in a given amount of time. According to further embodiments the control unit may be configured to delay a start of the test program until all necessitated tester subunits that signal that they operate within their specification limits (that they are in the so-called in spec state) to the control unit.

Furthermore, the control unit can be configured to put at least some of the plurality of tester subunits in different states of lower activity in dependence on the type of the tester subunit. Furthermore, at least one of the different states of lower activity can be a state in which a tester subunit, when it is put into the state remains in its specification limits. Another state of lower activity may be a state in which the tester subunit gets outside its specification limits but is capable of getting back into its specification limits after being put back into the state of higher activity. For the case in which the tester subunit gets out of its specification limits, the control unit can wait until this tester subunit is in its specification limits after putting this tester subunit in the state of higher activity before it performs an instruction of the test program on this tester subunit. Hence, it is ensured that the test program is not started or continued on this tester subunit before the tester subunit is again within its specification limits.

According to further embodiments, a further way of ensuring that only tester subunits are used for performing a test on the device under test is that the control unit is configured to scan the test program for an upcoming tester subunit utilization and to put a tester subunit, which, when being in the state of lower activity went out of its specification limit, into the state of higher activity before this tester subunit is needed for performing an instruction of the test program, such that when the instruction is to be performed afterwards this tester subunit is already back in its specification limns. In other words, the control unit can be configured to scan the test program in advance for an upcoming resource utilization and can put tester subunits which need a certain amount of time to get back in their specification limits into the state of higher activity already before the tester subunits are needed such that, when the tester subunits are needed afterwards, they are already in their specification limits. This has the advantage that the control unit does not have to pause the test program and to wait until a tester subunit, which was in a state of lower activity, is back in its specification limits.

Hence, some embodiments of the present invention relate to an automated integrated circuit tester with the particular property of having a specific power control system to lower or to minimize the power consumption during operation and in an idle state.

Furthermore, further embodiments of the present invention are also related to a method to either allow the manual user control of power consumption or to have the power consumption to be controlled automatically by the automatic test system, for example, according to user guidelines. Further embodiments of the present invention are also related to a method of generating specific information to indicate the status of a tester resource (or of a tester subunit) with respect to its accuracy specifications, which for example, may be given by the manufacturer of the automatic test equipment. Such a resource status detection (which may be understood as detection if a tester subunit is within its specification limits) can go far beyond just protecting the tester subunit from destruction by simply measuring a temperature.

Further embodiments of the present invention relate to a method and a computer program for testing a device under test.

BRIEF DESCRIPTION OF THE DRAWINGS

Embodiments of the present invention will be detailed subsequently referring to the appended drawings, in which.

DETAILED DESCRIPTION OF THE INVENTION

Before embodiments of the present invention are described in detail, it is to be pointed out that the same or functionally equivalent elements are provided with the same reference numbers and that a repeated description of elements having the same reference numbers is omitted. Hence, descriptions provided for elements having the same reference numbers are mutually exchangeable.

Figure 1:
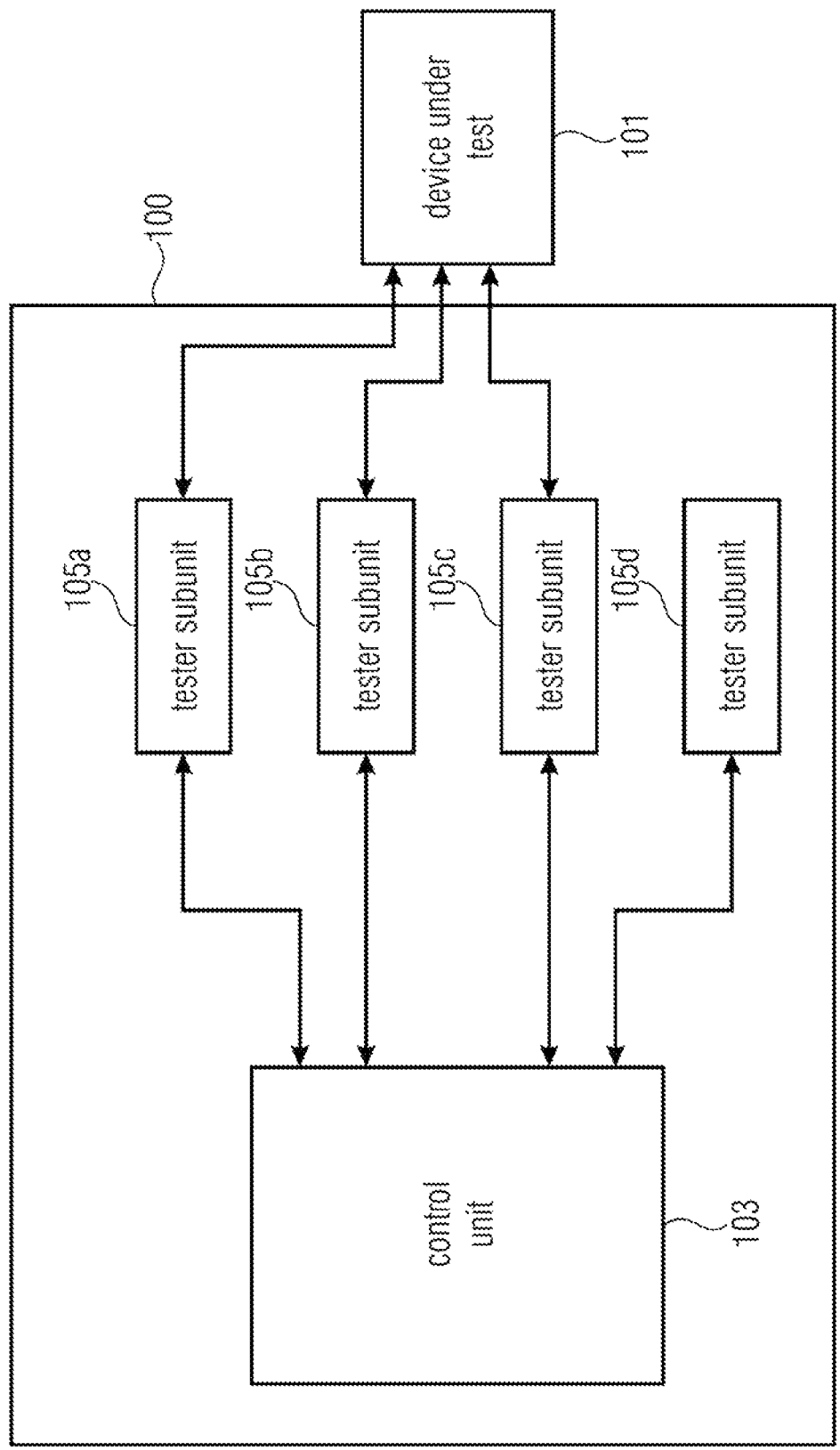
FIG. 1 shows a block schematic diagram of an automated test equipment according to an embodiment of the present invention.

FIG. 1 shows a block schematic diagram of an automated test equipment 100 (ATE 100) for testing a device under test 101 according to an embodiment of the present invention.

The automated test equipment 100 comprises a control unit 10 and a plurality of tester subunits 105a-105d. Although in the example shown in FIG. 1 the automated test equipment 100 comprises four tester subunits 105a-105d, this number of tester subunits may be arbitrary and may depend on the purpose of the automated test equipment 100. Furthermore, although in the example shown in FIG. 1 the automated test equipment 100 is only coupled to one device under test 101 typically such an automated test equipment 100 may be configured to test a plurality of devices under test 101 (even simultaneously).

The control unit 103 of the automated test equipment 100 is configured to put the tester subunits 105a-105d in a state of lower activity in dependence on a current demand on the tester subunits 105a-105d. As an example, and as already has been described in the introductory part of this application, the control unit 103 may be configured to put a tester subunit of a plurality of tester subunits 105a-105d into a state of lower activity when the particular tester subunit 105a-105d is currently not used or needed for testing the device under test 101. By having the control unit 103 in conjunction with the tester subunit 105a-105d and the capability of putting the tester subunits 105a-105d, individually from each other, into a state of lower activity the current consumption of tester subunits 105a-105d which are currently not needed (for which there is currently no demand) can be dramatically reduced when compared to systems, in which tester subunits which are currently not used remain in their state of higher activity. Furthermore, the control unit 103 is configured to put a tester subunit 105a-105d, which is currently in a state of lower activity in a state of higher activity when the tester subunit 105a-105d is currently needed or will be needed for performing a test on the device under test 101.

As can be seen from FIG. 1 not all the tester subunits 105a-105d need necessarily be connected to device under test 101 or be used to perform tests on the device 101. As an example, the tester subunit 105d may be an external infrastructure unit (such as a cooling pump of the automated test equipment 100 for cooling or heating up the other tester subunits 105a to 105c). Such a cooling pump may be activated (put in a state of higher activity) and deactivated (put in a state of lower activity) by the control unit 103, for example, in dependence on a temperature of certain tester subunits 105a-105c of the automated test equipment 100 or in general in dependence on a temperature of the automated test equipment 100. Other tester subunits (such as the tester subunits 105a-105c) may be tester subunits which perform certain tests on the device under test, for example, may be part of a test head of the automated test equipment 100, such tester subunit may form a test resource of the automated test equipment 100. Furthermore, the cooling pump may not only be activated or deactivated but could be also continuously reduced or increased in cooling power. As an example, for a case in which a large number of tester subunits are active (e.g. perform tests on the device under test 100), the cooling pump may be in a state with an increased cooling power when compared to a case in which only a smaller number of tester subunits are active but in which the cooling pump is still active. In other words the control unit 103 is configured to continuously adjust a cooling power of the cooling pump in dependence on the current demand on the rest of the tester subunits of the automated test equipment 100.

In other words, a tester subunit of the plurality of tester subunits 105a-105d can be a central unit of the tester or automated test equipment 100 (such as a cooling unit of the automated test equipment 100) or may be a main test(er) resource (such as an electronic card, a channel board or a device under test power supply). The power consumption of the whole automated test equipment 100 is varied by the control unit 103 by either lowering the activity of such central units of the tester 100 or by controlling the activity of the main test resources such as the mentioned electronic upon need (or in other words, in dependence on a demand on these tester subunits 105a-105d). The control of the power consumption by the control unit 103 can comprise a complete activation or deactivation of one of the tester subunits 105a-105d as well as the transition into a low power state. In other words, a state of lower activity can be a state in which the tester subunit 105a-105d is completely deactivated or in which a power consumption of the tester subunit 105a-105d is reduced when compared to a state of higher activity. It is to be pointed out that the control unit 103 can be configured to put at least some of the plurality of tester subunits 105a-105d in different states of lower activity (such as complete deactivation of the tester subunit or only reduction of power consumption) in dependence on the type of the tester subunit 105a-105d.

As an example, the control unit 103 is configured such that only the tester subunits 105a-105d are switched off or deactivated when they are put in a state of lower activity, which either do not fall out of their specification limits or are capable of getting back into their specification limits without any additional calibration needed. For tester subunits 105a-105d which would or even only could get out of their specification limits when they are deactivated or switched off without having the capability of automatically getting back into their specification limits, the control unit 103 would put such tester subunits 105a-105d in a state of lower activity in which the power consumption of the corresponding tester subunits 105a-105d is reduced but the tester subunits are still kept in their specification limits.

In other words, at least one of the different states of lower activity is a state in which a tester subunit (e.g. the first tester subunit 105a), when it is put into the state remains in its specification limits or in which a tester subunit gets outside its specification limits but is capable of getting back into its specification limits after being put back into the state of higher activity by the control unit 103 (without any need for an external calibration, which may be only performed by the manufacturer of the automated test equipment 100). In other words, such tester subunit is capable of automatically getting back into its specification limits after being put back into the state of higher activity.

Furthermore, at least one of the different states of lower activity can be a state in which a tester subunit (e.g. the first tester subunit 105a) when it is put into the state is deactivated.

The control of the tester subunits 105a-105d can be achieved by a global centralized control and/or by a decentralized intelligence in a functional tester unit or a tester resource combined with the system for the exchange of respective power control signals. In other words, the control unit 103 may be a centralized element of the automatic test equipment 100 but may be further separated into a plurality of decentralized units and a centralized main unit, which exchange power control signals with the tester subunits 105a-105d for controlling the activity levels or activity states of the tester subunits 105a-105d.

Furthermore, the control unit 103 is configured to run a test program and to control based on the test program (e.g. based on instructions in the test program) the plurality of tester subunits 105a-105d. Furthermore, the control unit 103 is configured to (automatically) derive the current demand on (each individual) tester subunit based on the current utilization of the plurality of tester subunits in the test program. In other words, the control unit 103 is capable of determining for each tester subunit of the plurality of tester subunits 105a-105d if it is currently or in the near future needed in the test program (e.g. for performing a test on the device under test 101) and is capable of controlling the states of activity of the tester subunits 105a-105d in dependence on this determination. Hence, there is no need for a user to explicitly instruct the control unit 103 to put a certain tester subunit 105a-105d into a state of lower activity or a state of higher activity, as the control unit 103 is capable of automatically determining if a tester subunit 105a-105d is needed or not. Nevertheless, the control unit 103 may additionally offer the possibility for manual user input which provides the functionality that a user can manually decide if a tester subunit 105-105d should enter a state of lower activity or a state of higher activity. In other words, the control unit 103 is configured, for controlling the power consumption with the purpose to reduce the cost of energy, to evaluate manual user inputs or (when requested) to automatically extract information from a configuration found in the test program. The user input and the information extracted by the control unit 103 automatically are interpreted with respect to what the tester subunits (which functional units and which tester resources) are essentially and minimally necessitated and which activity level a certain infrastructure units need to attain to reliably run the test program. The control unit 103 (or in other words the power control system of the ATE 100) activates and deactivates tester subunits that are not needed for running the specific test program according to this concept and/or also adjust the activity levels of tester subunits like centralized infrastructure units appropriately (such as a cooling pump).

Furthermore, it has been found by the inventors that, if a tester subunit is put into a low power state or when it is deactivated because there is currently no need to supply power for in general when a tester subunit is put into a state of lower activity), the tester subunits ability to perform according to specifications after a turn on (after the tester subunit is put into its state of higher activity) may be affected. Therefore, the control unit 103 can be configured to specifically process status information generated from the tester subunits 105a-105d related to the accuracy of the tester subunits 105a-105d. This status information can be produced from a plurality of sensors and parameters supplied by the operating system or stored in the hardware (e.g. in each of the tester subunits 105a-105d). According to user inputs and/or factory supplied information the control unit 103 either keeps the tester subunit in the "in spec" state (in its specification limits) with a minimum number of power supplied or it ensures that the tester subunit 105a-105d attains the "in spec" status after being activated for operation in a given amount of time. According to further embodiments of this turn on procedure the control unit 103 can be configured to delay the start of the test program or to delay the continuation of the test program until all necessitated tester subunits have signaled the "in spec" status to the control unit 103.

In other words, the control unit 103 can be configured to, when a tester subunit (for example the first tester subunit 105a), while being in the state of lower activity went out of its specification limits, wait until the first tester subunit 105a is back in its specification limits after putting the first tester subunit 105a in the state of higher activity before the control unit 103 performs an instruction of the test program on the first tester subunit 105a. By having this concept it can be ensured that instructions on tester subunits are only performed when the corresponding tester subunit is currently in its specification limit. According to further embodiments for eliminating any waiting time during performing a test program, the control unit 103 can be further configured to scan the test program for an upcoming, tester subunit utilization and to put a tester subunit (for example the second tester subunit 105b), which, when being in the state of lower activity went out of its specification limit, into the state of higher activity before the second tester subunit 105b is needed for performing an instruction of the test program. Hence it can be achieved that when the instruction for which the second tester subunit 105b is needed, is to be performed the second tester subunit 105b is already back in its specification limit.

In other words, the control unit 103 is configured to scan in advance the test program for upcoming changes in the utilization of the tester subunits 105a-105d and to "wake up" the second tester subunit 105b right before it is needed to perform an instruction in the test program, such that when the second tester subunit 105b is needed to perform the instruction of the test program the second tester subunit 105b is already bark in its specification limits. Hence, the control unit 103 does not need to wait with the continuation or the start of the test program until the second tester subunit 105b is back in its specification limit as by this scanning of the test program in advance it can be ensured that in the moment of time in which the second tester subunit 105b is needed it is already back in its specification limits.

As already pointed out, a tester subunit can be configured to signal that it is out or in its specification limits (for example by providing a corresponding signal to the control unit 103). As an example, the first tester subunit 105a-105d can each be configured to provide an in specification signal to the control unit 103 which signals if the tester subunit 105a-105d is currently within its specification limits or not. In other words, the tester subunits 105a-105d are configured to generate specific information to indicate the status of the tester subunits 105a-105d (for example with respect to its accuracy specifications which are given by the manufacturer of the ATE 100). This tester subunit status detection performed by the tester subunits 105a-105d can go far beyond just protecting the tester subunits 105a-105d from destruction by simply measuring a temperature.

In other words, a tester subunit can be configured to signal that this tester subunit is out of its specification limits, for example:

when a temperature of this tester subunit or of cooling water for this tester subunit is out of a temperature range for which the tester subunit is calibrated;

when a certain clock frequency inside the tester subunit is out of its calibrated values; and/or when a loopback test or a board reference test of this tester subunit failed.

A loopback test can be performed, when the tester subunit has a stimulus channel and a response channel. In such a loopback test, the stimulus channel and the response channel are connected to each other. Furthermore a stimulus is applied to the stimulus channel and measured with the response channel. The loopback test fails when the measured stimulus does not comply with an expected response for the stimulus applied. The loopback test succeeds when the measured stimulus complies with the expected response for the stimulus applied.

For the hoard reference test a hoard reference (such as a voltage at a hand gap circuit) can be measured with a certain measurement unit of the tester subunit, and when the measured results comply with an expected result for this board reference, the board reference test succeeds, otherwise it fails.

To summarize the above, embodiments of the present invention relate to an automated test equipment (such as an automated IC tester) with the particular property of having a specific power control system (the control unit 103) to lower or to minimize the power consumption during operation and art idle state of the automated test equipment 100. Furthermore, embodiments of the present invention relate to a method and a concept to either allow the manual user control of power consumption or to have the power consumption be controlled automatically by the automated test equipment 100 (for example according to user guidelines). Furthermore, embodiments of the resent invention relate to a method and a concept of generating specific information to indicate the status of a tester subunit with respect to its accuracy specifications given by the manufacturer of the automatic test equipment 100. This resource status detection goes far beyond just protecting, the tester subunit from destruction by simply measuring a temperature.

A further element of the power control method performed by the control unit 103—when activated—is the global power consumption reduction when the tester was not used for a certain amount of time or a time related signal is issued. In such a case, the tester minimizes power consumption to a level as specified by the user with respect to how it needs to be ramped up to operation again. This ensures that ramp down and ramp up is performed in a way that takes into account the user needs and the stability and reliability of the automated test equipment 100.

Figure 2:
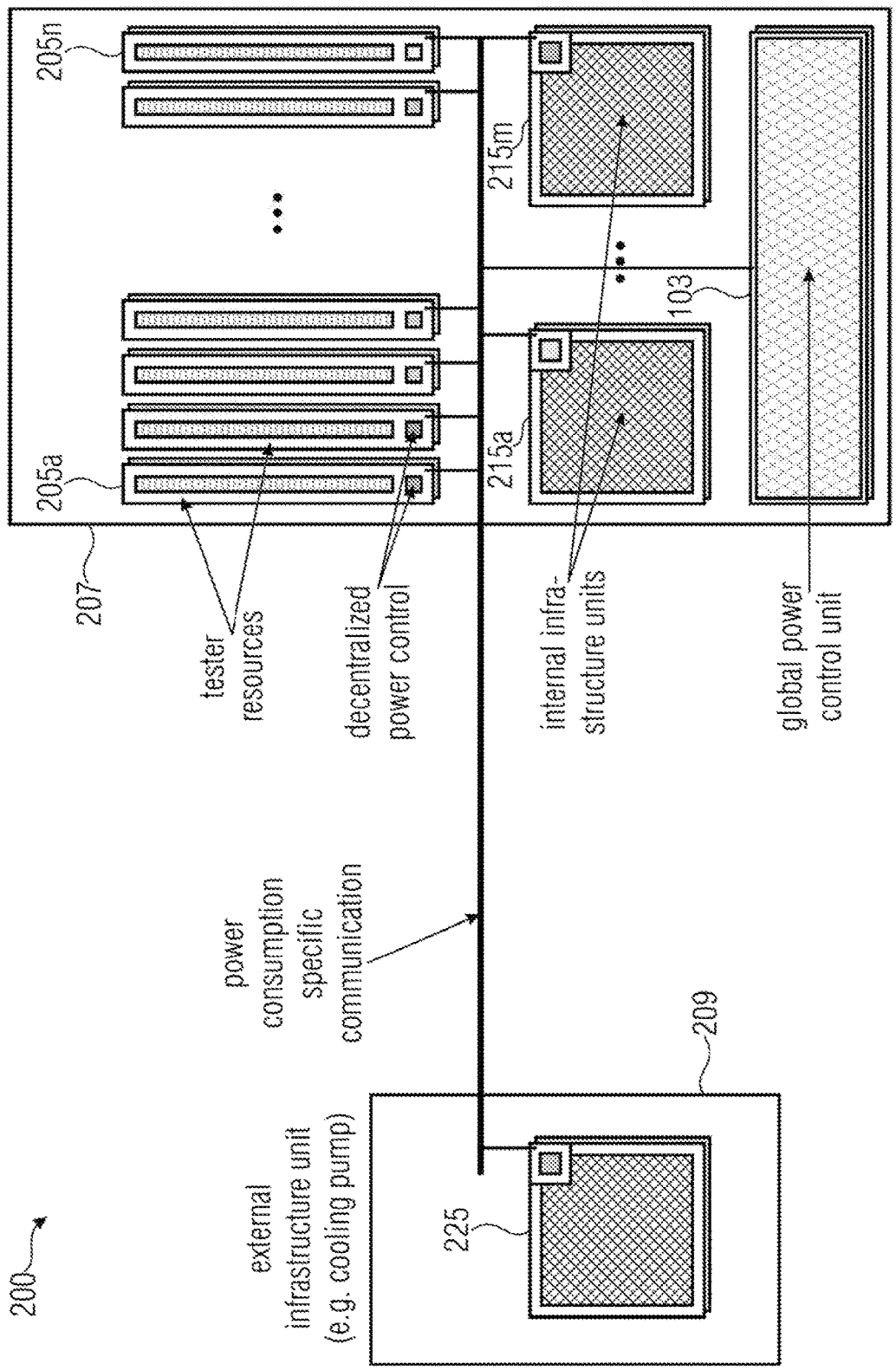
FIG. 2 shows a structure of a chip tester or automated test equipment according to an embodiment of the present invention with power consumption control.

FIG. 2 shows the structure of a chip tester 200 which is a possible implementation of the automated test equipment 100 shown in FIG. 1 according to an embodiment of the present invention.

The automated test equipment 200 comprises a plurality of tester subunits 205a-205n, 215a-215m, 225. As can be seen from the example of FIG. 2 the tester subunits can be classified in infrastructure units 215a-215m, 225 and tester resources 205a-205n. Nevertheless, the description provided for the tester subunits 105a-105d in the automated test equipment 100 shown in FIG. 1 are also applicable to the tester resources 205a-205n the (internal) infrastructure units 215a-215m and the (external) infrastructure unit 225. As can be seen from FIG. 2 the internal infrastructure units 215a-215m may be arranged in the same housing 207 of the automated test equipment 200 like the tester resources 205a-205n. The external infrastructure unit 225 (such as a cooling pump) may be placed in an external housing 209. Furthermore, the control unit 103 (e.g. a global power control unit 103) may be arranged in the housing 207 together with the internal infrastructure units 215a-215m and the tester resources 205a-205n. Furthermore, as can be seen from FIG. 2, the control unit 103 is connected to the complete pool of tester subunits (comprising the tester resources 205a-205n the internal infrastructure units 215a-215m and the external infrastructure unit 225) for controlling the activity state of the different tester subunits, for example, by means of a power consumption specific communication.

Furthermore, the control of the activity states of the tester subunits 205a-205n, 215a-215m, 225 can happen centralized or even decentralized. Hence, each of the tester subunits may comprise its own associated decentralized power control unit which is part of the global power control unit 103 and is configured to control the activity state of its associated tester subunit 205a-205n, 215a-215m, 225.

According to the example shown in FIG. 2, the automated test equipment 200 only comprises one single external infrastructure unit 225, according to further embodiments such an automated test equipment 200 may of course comprise further external infrastructure units.

Figure 3:
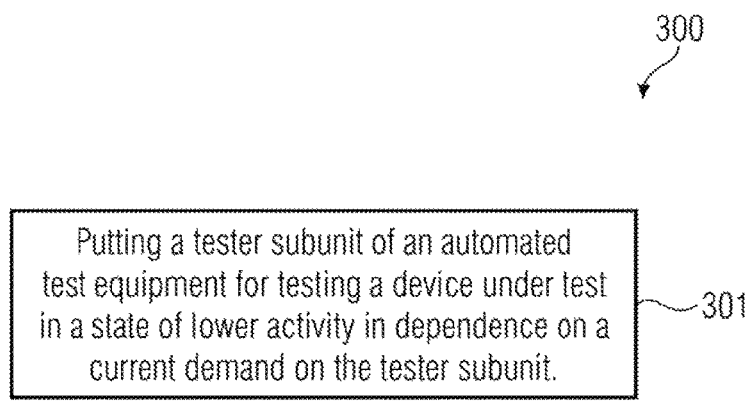
FIG. 3 shows a flow diagram of a method for resting a device under test according to an embodiment of the present invention.

FIG. 3 shows a flow diagram of a method for testing a device under test according to an embodiment of the present invention. The method 300 comprises a step of putting a tester subunit in a state of lower activity in dependence on a current demand on the tester subunit.

In other words, FIG. 3 shows a method 300 for dynamically or manually reducing the power consumption of a tester or an automated test equipment for testing a device under test by putting tester subunits in a state of lower activity in dependence on a current demand on the tester subunits.

Figure 4:
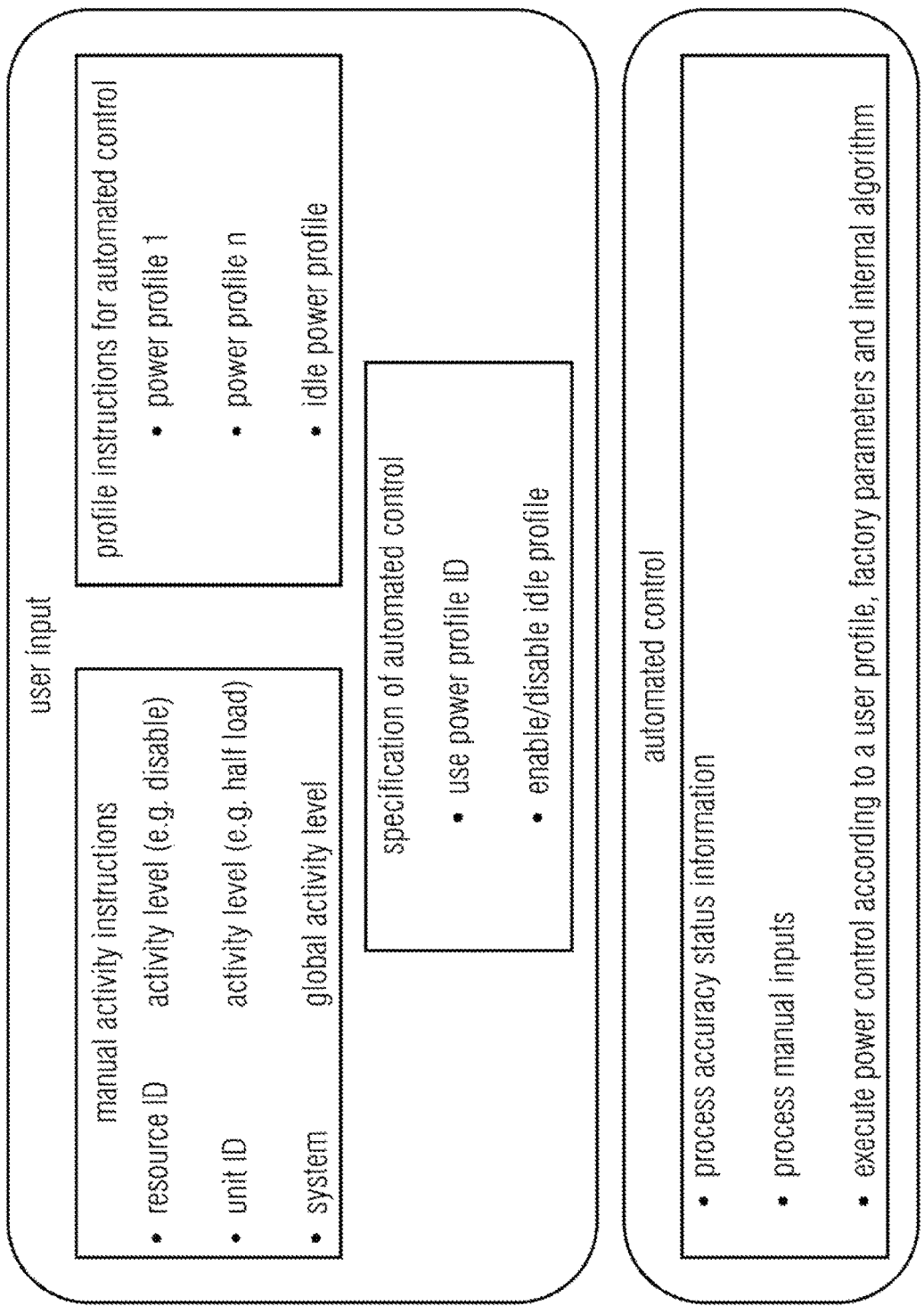
FIG. 4 shows an overview of an exemplary implementation of the concept of the present invention.

FIG. 4 shows further aspects of the present invention which can be implemented in the automated test equipment 100 and 200 or the method 300 according to embodiments of the present invention.

As an example, the control unit 103 can be configured to put tester subunits into a state of lower activity in dependence on manual activity instructions or profile instructions for an automated control.

Furthermore, a user may be able to instruct the control unit 103 to adjust the activity level of the tester resources 205a-205n (e.g. to disable a tester resource 205a-205n). Furthermore, a user may be able to instruct the control unit 103 to adjust the activity level of the infrastructure units 215a-215m, 225 (for example to reduce a load of the infrastructure units 215a-215m, 225 to only half load). Furthermore, the user may be able to instruct the control unit 103 to control a global activity level of the complete automated test equipment 200.

Furthermore, the control unit 103 can be configured to vary the putting off the tester subunits into different states of lower activity based on certain profile instructions (such as certain power profiles). As an example, an idle power profile may lead to a case in which all tester subunits of the automated test equipment 100, 200 are put into a state of lower activity.

Furthermore, a user may be able to specify the automated control, for example, by instructing the control unit 103 to use a certain power profile or to enable or disable an idle profile.

In the automated control mode the control unit 103 is capable of processing security status information received from the different tester subunits of the automated test equipment, to process manual inputs and furthermore to execute power control tasks according to a user profile, factory parameters and internal algorithms.

To summarize, embodiments of the present invention provide an IC tester, such as an automated test equipment. Furthermore, further embodiments of the present invention provide a method for dynamically or manually reducing the power consumption of such an IC tester. Further embodiments of the present invention provide an apparatus for configuring the necessitated active resources from a pool of available tester subunits such as available tester resources or available infrastructure units. Embodiments of the present invention improve the power stability of an automated test equipment and furthermore reduce the energy costs of an automated test equipment.

Furthermore, embodiments of the present invention have the advantage that tester subunits are disabled, send to low power modes or at least are reduced in activity when they are not used during a test run. This reduces the power consumption and thus the energy costs and in turn the complete costs for a test of a device under test.

To summarize, the automated reduction of the power consumption of an automated test equipment helps to avoid or to recover from overload situations and therefore helps to both stabilize production and increase the meantime between failures of an automated test equipment.

Furthermore, embodiments of the present invention provide an IC tester 100, 200, a method 300 for manually or dynamically reducing the power consumption and an apparatus (the control unit 103) for configuring the active resources from a pool of available tester subunits (infrastructure units and tester resources).

The method 300 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate for are capable of cooperating) with a programmable computer system such that the respective method is performed. Therefore, the digital storage medium may be computer readable.

Some embodiments according to the invention comprise as data carrier having electronically readable control signals, which are capable of cooperating with a programmable computer system, such that one of the methods described herein is performed.

Generally, embodiments of the present invention can be implemented as a computer program product with a program code, the program code being, operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An automated test equipment for testing a device under test, comprising:
    a plurality of tester subunits; and
    a control unit configured to:
        maintain one or more tester subunit of the plurality of tester subunits in a state of higher activity; and
        put a given tester subunit of the plurality of tester subunits in a state of lower activity in dependence on a current demand on the given one of the plurality of tester subunits, wherein at least one of the tester subunits of the plurality of tester subunits is configured to provide a signal to the control unit that signals whether or not the corresponding tester subunit is currently within its specification limits.

2. The automated test equipment according to claim 1, wherein the control unit is configured to run a test program and to control the plurality of tester subunits based on the test program; and wherein the control unit is configured to derive the current demand on the given tester subunit of the plurality of tester subunits based on a current utilization of the plurality of tester subunits in the test program.

3. The automated test equipment according to claim 2, wherein the test program is free of an instruction which instructs the control unit to put the given tester subunit of the plurality of the plurality of tester subunits into the state of lower activity.

4. The automated test equipment according to claim 1, wherein at least one tester subunit of the plurality of tester subunits is a tester resource configured to perform a test on the device under test and at least another tester subunit of the plurality of tester subunits is an infrastructure unit which is configured to ensure that the tester resource remains in its specification limits during performing the test on the device under test.

5. The automated test equipment according to claim 1, wherein the control unit is configured to put at least some of the tester subunits in different states of lower activity in dependence on the type of each of the some of the tester subunits.

6. The automated test equipment according to claim 5, wherein at least one of the different states of lower activity is a state in which a tester subunit of the plurality of tester subunits, when it is put into this state, remains in its specification limits or gets outside its specification limits but is capable of automatically getting back into its specification limits after being put back into a state of higher activity by the control unit.

7. The automated test equipment according to claim 5, wherein at least one of the different states of lower activity is a state in which a tester subunit of the plurality of tester subunits, when it is put into this state of lower activity, is deactivated.

8. The automated test equipment according to claim 1, wherein the control unit is configured to run a test program and to put a tester subunit of the plurality of tester subunits which is currently in a state of lower activity, in a state of higher activity when the tester subunit is needed for performing an instruction of the test program.

9. The automated test equipment according to claim 8, wherein when a first tester subunit of the plurality of tester subunits is out of its specification limits when in the state of lower activity and is needed for performing an instruction of the test program, the control unit is configured to put the first tester subunit in the state of higher activity and wait until the first tester subunit is back in its specification before the control unit lets the first tester subunit perform the instruction of the test program.

10. The automated test equipment according to claim 8, wherein the controller is configured to scan the test program for an upcoming tester subunit utilization and to put a second tester subunit of the plurality of tester subunits, that is in the state of lower activity and is out of its specification limits, into the state of higher activity before the second tester subunit is needed for performing an instruction of the test program, such that when the instruction of the test program is to be performed, the second tester subunit is in its specification limits.

11. The automated test equipment according to claim 1, wherein the at least one tester subunit is configured to signal that it is out of its specification limits: when the temperature of the tester subunit or of cooling water for this tester subunit is out of a range for which the tester subunit is calibrated; when a certain clock frequency inside the tester subunit is out of its calibrated values; or when a loopback test or a board reference test of this tester subunit failed.

12. The automated test equipment according to claim 1, wherein at least one of the tester subunits is a cooling pump for cooling and for heating at least another of the plurality of tester subunits, wherein the control unit is configured to adjust a cooling power of the cooling pump according to a number of the tester subunits that are active.

13. The automated test equipment according to claim 12, wherein at least one of the tester subunits is a cooling pump for cooling or heating up at least another of the plurality of tester subunits, wherein the control unit is configured to continuously adjust a cooling power of the cooling pump in dependence on a current demand on the rest of the tester subunits.

14. The automated test equipment according to claim 1, wherein at least one of the tester subunits is a test head for being connected to the device under test.

15. A method comprising:
    maintaining one or more of a plurality of tester subunits of an automated test equipment in a state of higher activity;
    putting a given one of the plurality of tester subunits in a state of lower activity in dependence on a current demand on the tester subunit; and
    receiving a signal from at least one of the tester subunits of the plurality of tester subunits that signals whether or not the corresponding tester subunit is currently within its specification limits.

16. The method according to claim 15, further comprising a non-transitory digital storage medium having a computer program stored thereon to perform the method when said computer program is run by a computer.

17. An automated test equipment comprising:
    a plurality of tester subunits; and
    one or more control units, communicatively coupled together and communicatively coupled to the plurality of tester subunits, to put the plurality of tester subunits in a state of higher activity, and to put any of the plurality of tester subunits individually from each other in a state of lower activity adapted to consume less power in dependence on a current demand of the individual tester subunit, wherein at least one of the tester subunits of the plurality of tester subunits is configured to provide a signal to at least one of the one or more control units to signal whether or not the corresponding tester subunit is currently within its specification limits.

18. The automated test equipment according to claim 17, wherein any of the plurality of tester subunits in a state of lower activity is still activated.

19. The automated test equipment according to claim 17, wherein any of the plurality of tester subunits is put in a state of lower activity, individually from each other, in dependence on one of a current demand on the given tester subunit, derived from as test program but not from an instruction in the test program, and from a user input signal.

20. The automated test equipment according to claim 17, wherein at least one of the tester subunits is a cooling pump for cooling and for heating at least another of the plurality of tester subunits, wherein the control unit is configured to adjust a cooling power of the cooling pump according to a number of the tester subunits that are active.

* * * * *